(12) United States Patent
Takeda et al.

(10) Patent No.: US 12,283,934 B2
(45) Date of Patent: Apr. 22, 2025

(54) SWITCHING CIRCUIT AND FRONT END CIRCUIT

(71) Applicant: Murata Manufacturing Co., Ltd., Kyoto (JP)

(72) Inventors: Risa Takeda, Kyoto (JP); Takehiko Kato, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 109 days.

(21) Appl. No.: 18/192,819

(22) Filed: Mar. 30, 2023

(65) Prior Publication Data
US 2023/0318576 A1 Oct. 5, 2023

(30) Foreign Application Priority Data
Mar. 31, 2022 (JP) .................................. 2022-060625

(51) Int. Cl.
*H03H 11/04* (2006.01)
(52) U.S. Cl.
CPC .................................. *H03H 11/04* (2013.01)
(58) Field of Classification Search
CPC . H03H 11/04; H04B 1/54; H04B 1/40; H03K 17/161; H03K 17/6871
See application file for complete search history.

(56) References Cited

U.S. PATENT DOCUMENTS

| | | | |
|---|---|---|---|
| 2020/0162121 A1* | 5/2020 | Doyle | H04B 1/18 |
| 2021/0306025 A1* | 9/2021 | Yoo | H01Q 1/38 |
| 2022/0224385 A1* | 7/2022 | Kotilainen | H04B 7/0617 |

FOREIGN PATENT DOCUMENTS

JP 2000-68807 A 3/2000

* cited by examiner

*Primary Examiner* — Sibin Chen
(74) *Attorney, Agent, or Firm* — McDonald Hopkins LLC

(57) ABSTRACT

A switching circuit includes a first antenna terminal and a second antenna terminal, a first input-output terminal and a second input-output terminal, a plurality of switches and a ground switch. When an electrical connection destination of the first input-output terminal is switched to the first antenna terminal, a first path switch included in the plurality of switches and provided along a first path connecting the first input-output terminal and the first antenna terminal to each other, and a second path switch and the ground switch provided along a second path connecting the second input-output terminal and the ground to each other, the second path switch included in the plurality of switches, are in conducting states, and a third path switch included in the plurality of switches and provided along a third path connecting the first path and the second path to each other is in a non-conducting state.

13 Claims, 10 Drawing Sheets

| | LOGIC OF SWITCHING CIRCUIT 151 | LOGIC OF SWITCHING CIRCUIT ACCORDING TO FIRST COMPARATIVE EXAMPLE |
|---|---|---|
| SWITCH 62 | CONDUCTING STATE | CONDUCTING STATE |
| SWITCH 64 | NON-CONDUCTING STATE | NON-CONDUCTING STATE |
| SWITCH 65 | NON-CONDUCTING STATE | NON-CONDUCTING STATE |
| SWITCH 63 | CONDUCTING STATE | NON-CONDUCTING STATE |
| GROUND SWITCH 81 | CONDUCTING STATE | NON-CONDUCTING STATE |

|  | LOGIC OF SWITCHING CIRCUIT 151 | LOGIC OF SWITCHING CIRCUIT ACCORDING TO FIRST COMPARATIVE EXAMPLE |
|---|---|---|
| SWITCH 62 | NON-CONDUCTING STATE | NON-CONDUCTING STATE |
| SWITCH 64 | CONDUCTING STATE | NON-CONDUCTING STATE |
| SWITCH 65 | CONDUCTING STATE | CONDUCTING STATE |
| SWITCH 63 | NON-CONDUCTING STATE | NON-CONDUCTING STATE |
| GROUND SWITCH | CONDUCTING STATE | NON-CONDUCTING STATE |

FIG. 12

| | LOGIC OF SWITCHING CIRCUIT 152 | LOGIC OF SWITCHING CIRCUIT ACCORDING TO SECOND COMPARATIVE EXAMPLE |
|---|---|---|
| SWITCH 62 | CONDUCTING STATE | CONDUCTING STATE |
| SWITCH 63 | CONDUCTING STATE | NON-CONDUCTING STATE |
| SWITCH 161 | NON-CONDUCTING STATE | NON-CONDUCTING STATE |
| GROUND SWITCH 81 | CONDUCTING STATE | NON-CONDUCTING STATE |
| SWITCH 66 | NON-CONDUCTING STATE | NON-CONDUCTING STATE |
| SWITCH 64 | NON-CONDUCTING STATE | NON-CONDUCTING STATE |
| SWITCH 65 | NON-CONDUCTING STATE | NON-CONDUCTING STATE |
| SWITCH 67 | NON-CONDUCTING STATE | NON-CONDUCTING STATE |

FIG. 13

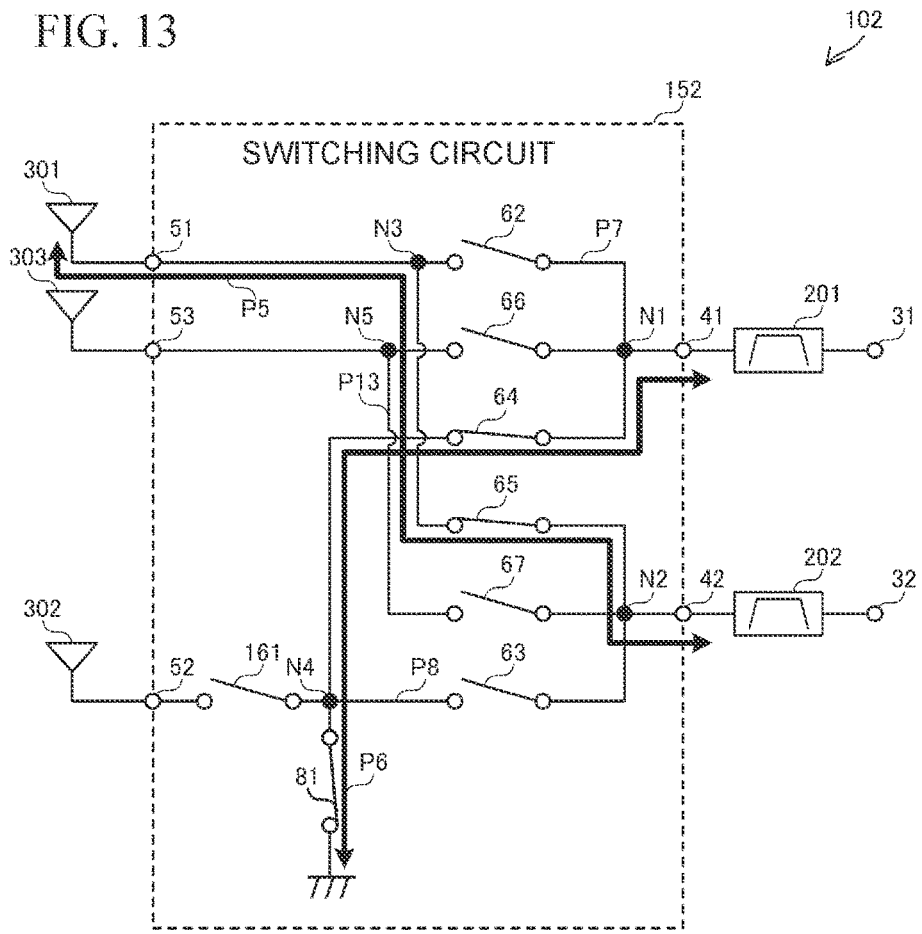

FIG. 14

| | LOGIC OF SWITCHING CIRCUIT 152 | LOGIC OF SWITCHING CIRCUIT ACCORDING TO SECOND COMPARATIVE EXAMPLE |
|---|---|---|
| SWITCH 62 | NON-CONDUCTING STATE | NON-CONDUCTING STATE |
| SWITCH 63 | NON-CONDUCTING STATE | NON-CONDUCTING STATE |
| SWITCH 161 | NON-CONDUCTING STATE | NON-CONDUCTING STATE |
| GROUND SWITCH 81 | CONDUCTING STATE | NON-CONDUCTING STATE |
| SWITCH 66 | NON-CONDUCTING STATE | NON-CONDUCTING STATE |
| SWITCH 64 | CONDUCTING STATE | NON-CONDUCTING STATE |
| SWITCH 65 | CONDUCTING STATE | CONDUCTING STATE NON- |
| SWITCH 67 | NON-CONDUCTING STATE | CONDUCTING STATE |

| | LOGIC OF SWITCHING CIRCUIT 153 | LOGIC OF SWITCHING CIRCUIT ACCORDING TO THIRD COMPARATIVE EXAMPLE |
|---|---|---|
| SWITCH 69 | CONDUCTING STATE | NON-CONDUCTING STATE |
| SWITCH 71 | NON-CONDUCTING STATE | NON-CONDUCTING STATE |
| SWITCH 162 | CONDUCTING STATE | CONDUCTING STATE NON- |
| SWITCH 74 | CONDUCTING STATE OR NON-CONDUCTING STATE | CONDUCTING STATE |
| SWITCH 73 | CONDUCTING STATE | NON-CONDUCTING STATE |
| SWITCH 70 | CONDUCTING STATE | NON-CONDUCTING STATE |
| GROUND SWITCH 81 | CONDUCTING STATE | CONDUCTING STATE |
| SWITCH 72 | CONDUCTING STATE | NON-CONDUCTING STATE |
| SWITCH 68 | CONDUCTING STATE | CONDUCTING STATE |
| GROUND SWITCH 82 | NON-CONDUCTING STATE | NON-CONDUCTING STATE |
| SWITCH 163 | NON-CONDUCTING STATE | NON-CONDUCTING STATE |
| SWITCH 161 | NON-CONDUCTING STATE | NON-CONDUCTING STATE |

US 12,283,934 B2

SWITCHING CIRCUIT AND FRONT END CIRCUIT

CROSS REFERENCE TO RELATED APPLICATION

This application claims priority from Japanese Patent Application No. 2022-060625 filed on Mar. 31, 2022. The content of this application is incorporated herein by reference in its entirety.

BACKGROUND ART

The present disclosure relates to a switching circuit and a front end circuit.

There is an antenna switch semiconductor integrated circuit that prevents degradation of characteristics specific to a specific conduction path, reduces transfer loss along a conduction path, and furthermore improves isolation characteristics of a non-conduction path (for example, see Japanese Unexamined Patent Application Publication No. 2000-68807).

BRIEF SUMMARY

In the antenna switch semiconductor integrated circuit described in Japanese Unexamined Patent Application Publication No. 2000-68807, conduction and non-conduction of a plurality of switches formed by gallium arsenide field effect transistors are controlled in accordance with external control signals.

These switches include a switch provided in series with a wiring line in order to perform conduction path switching (hereinafter also referred to as a series switch) and a switch provided between the wiring line and ground in order to ground the wiring line (hereinafter also referred to as a shunt switch).

The switches have parasitic capacitances, and thus part of a radio frequency signal may be conducted even in non-conducting states. Thus, a radio frequency signal may leak from a conduction path to a non-conduction path through a switch that is in a non-conducting state.

In the antenna switch semiconductor integrated circuit, by causing the switch serving as a shunt switch to be in a conducting state, the non-conduction path is shorted to ground potential, so that leakage of the above-described radio frequency signal is suppressed. As a result, leakage through the series switch that is in a non-conducting state is reduced, and isolation characteristics are improved.

However, the antenna switch semiconductor integrated circuit is provided with four shunt switches and thus has a large circuit scale. A technology for suppressing, with a small circuit scale, a reduction in isolation characteristics is desired.

The present disclosure provides a switching circuit and a front end circuit that can suppress, with a small circuit scale, a reduction in isolation characteristics.

A switching circuit according to an aspect of the present disclosure includes a first antenna terminal and a second antenna terminal, a first input-output terminal and a second input-output terminal, a plurality of switches that are capable of switching an electrical connection destination of the first input-output terminal to either one of the first antenna terminal and the second antenna terminal, are capable of switching an electrical connection destination of the second input-output terminal to either one of the first antenna terminal and the second antenna terminal, and are provided such that it is possible to electrically connect the first input-output terminal and the second input-output terminal to each other, and a ground switch that has a first end electrically connected to the second input-output terminal through one or more of the plurality of switches, and has a second end connected to ground. When the electrical connection destination of the first input-output terminal is switched to the first antenna terminal, a first path switch included in the plurality of switches and provided along a first path connecting the first input-output terminal and the first antenna terminal to each other, and a second path switch and the ground switch provided along a second path connecting the second input-output terminal and the ground to each other, the second path switch being included in the plurality of switches, are in conducting states, and a third path switch included in the plurality of switches and provided along a third path connecting the first path and the second path to each other is in a non-conducting state.

According to the present disclosure, a switching circuit and a front end circuit can be provided that can suppress, with small circuit scales, a reduction in isolation characteristics.

BRIEF DESCRIPTION OF THE DRAWINGS

FIG. 12 is a logic table LT3 illustrating states of individual switches of a switching circuit 152 in the fifth connection state;

FIG. 13 is a circuit diagram of the front end circuit 102, which is in a sixth connection state;

FIG. 14 is a logic table LT4 illustrating states of the individual switches of the switching circuit 152 in the sixth connection state;

FIG. 16 is a logic table LT5 illustrating states of individual switches of a switching circuit 153 in the seventh connection state.

DETAILED DESCRIPTION

In the following, embodiments of the present disclosure will be described in detail with reference to the drawings.

Note that the same elements will be denoted by the same symbols, and redundant description will be omitted as much as possible.

First Embodiment

Figures 1, 2:
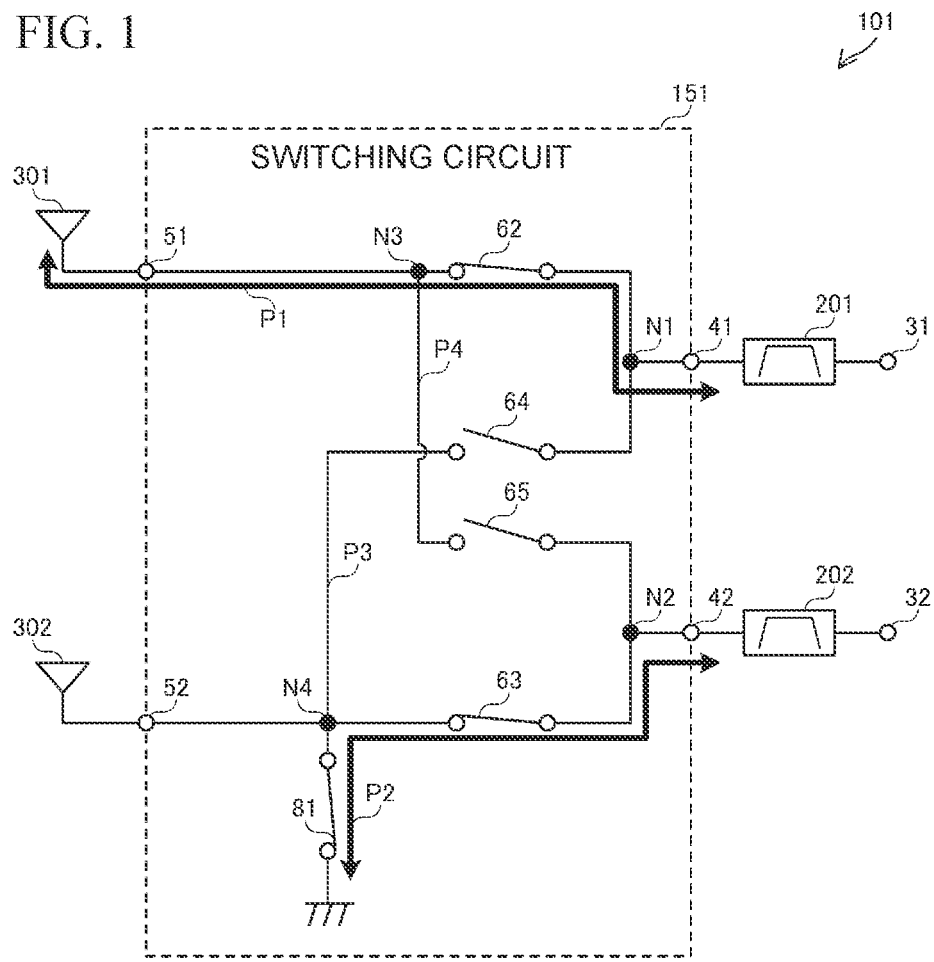
FIG. 1 is a circuit diagram of a front end circuit 101, which is in a first connection state.
FIG. 2 is a logic table LT1 illustrating states of individual switches of a switching circuit 151 in the first connection state.

A front end circuit 101 according to a first embodiment will be described. FIG. 1 is a circuit diagram of the front end circuit 101, which is in a first connection state.

As illustrated in FIG. 1, the front end circuit 101 has a switching circuit 151, a filter circuit 201 (a second filter circuit), and a filter circuit 202 (a first filter circuit). The switching circuit 151 includes an input-output terminal 41 (a first input-output terminal), an input-output terminal 42 (a second input-output terminal), an antenna terminal 51 (a first antenna terminal), an antenna terminal 52 (a second antenna terminal), a switch 62 (a second switch), a switch 63 (a third switch), a switch 64 (a fourth switch), a switch 65 (a fifth switch), and a ground switch 81.

The front end circuit 101 is provided in, for example, a mobile communication device that can communicate using the 5th generation mobile communication system (5G). The filter circuit 201 of the front end circuit 101 has a first end connected to the input-output terminal 41 of the switching circuit 151 and has a second end connected to a terminal 31. The filter circuit 202 has a first end connected to the input-output terminal 42 of the switching circuit 151 and has a second end connected to a terminal 32.

On the opposite side of the filter circuits 201 and 202 from the terminals 31 and 32, a power amplifier and a low noise amplifier are provided. The power amplifier amplifies and outputs a transmission signal, and the low noise amplifier receives and amplifies a reception signal. The transmission signal and the reception signal are, for example, radio frequency (RF) signals. Note that, on the opposite side of the filter circuits 201 and 202 from the terminals 31 and 32, only one out of the power amplifier and the low noise amplifier may be provided.

The antenna terminals 51 and 52 are connected to a main antenna 301 and a diversity antenna 302, respectively. Signals transmitted by and signals received by the main antenna 301 and signals received by the diversity antenna 302 include data signals including information on, for example, moving images and voice and sound. Signals transmitted by the diversity antenna 302 include a sounding reference signal (SRS) for monitoring power and delay in transmission paths between a base station and the individual antenna terminals within the mobile communication device.

A time period in which a sounding reference signal is transmitted is short, and thus a time period in which radio waves are transmitted from the diversity antenna 302 through the antenna terminal 52 is shorter than a time period in which radio waves are transmitted from the main antenna 301 through the antenna terminal 51.

The switches 62, 63, 64, and 65 of the switching circuit 151 can switch an electrical connection destination of the input-output terminal 41 to either one of the antenna terminals 51 and 52, can switch an electrical connection destination of the input-output terminal 42 to either one of the antenna terminals 51 and 52, and are provided such that the input-output terminal 41 and the input-output terminal 42 can be electrically connected to each other.

Specifically, the switch 62 is provided between the antenna terminal 51 and the input-output terminal 41. The switch 63 is provided between the antenna terminal 52 and the input-output terminal 42. The switch 64 is provided between the antenna terminal 52 and the input-output terminal 41. The switch 65 is provided between the antenna terminal 51 and the input-output terminal 42.

More specifically, the switch 62 has a first end connected to the antenna terminal 51 with a node N3 interposed therebetween and has a second end connected to the input-output terminal 41 with a node N1 interposed therebetween. The switch 63 has a first end connected to the antenna terminal 52 with a node N4 interposed therebetween and has a second end connected to the input-output terminal 42 with a node N2 interposed therebetween.

The switch 64 has a first end connected to the node N4 and has a second end connected to the node N1. The switch 65 has a first end connected to the node N3 and has a second end connected to the node N2. The ground switch 81 has a first end connected to the node N4 and has a second end connected to ground.

First Connection State

FIG. 2 is a logic table LT1 illustrating the states of the individual switches of the switching circuit 151 in the first connection state and the states of individual switches of a switching circuit according to a first comparative example in the first connection state. In this case, the switching circuit according to the first comparative example has substantially the same circuit configuration as the switching circuit 151; however, the switching circuit according to the first comparative example is a circuit controlled using logic for controlling the states of the individual switches to be in different states from the individual switches of the switching circuit 151. As illustrated in FIGS. 1 and 2, in the first connection state, the electrical connection destination of the input-output terminal 41 is switched to the antenna terminal 51, and the electrical connection destination of the input-output terminal 42 is switched to ground.

Specifically, in the first connection state, a first path switch provided along a path P1 (a first path) connecting the input-output terminal 41 and the antenna terminal 51 to each other, and a second path switch and the ground switch 81 provided along a path P2 (a second path) connecting the input-output terminal 42 and ground to each other are in conducting states, and third path switches provided along a path P3 (a third path) and a path P4 (the third path), which connect the path P1 and the path P2 to each other, are in non-conducting states.

In this case, the path P1 is a path extending from the input-output terminal 41 to the antenna terminal 51 through the nodes N1 and N3. The path P2 is a path extending from the input-output terminal 42 to ground through the nodes N2 and N4. The path P3 is a path extending from the node N1 to the node N4 through the switch 64. The path P4 is a path extending from the node N2 to the node N3 through the switch 65. Along the path P1, data signals are transferred.

The first path switch and the second path switch are the switches 62 and 63, respectively. The third path switches are the switches 64 and 65.

In the first connection state, the first end of the ground switch 81 is electrically connected to the input-output terminal 42 through the switch 63, which is one of the switches 62, 63, 64, and 65. Moreover, the first end of the ground switch 81 is not directly connected to the path P1 or the path connecting the input-output terminal 42 and the antenna terminal 51 to each other. Specifically, the first end of the ground switch 81 is indirectly connected to the path P1 with the switch 64, which is in the non-conducting state, interposed therebetween. Moreover, the first end of the ground switch 81 is indirectly connected to the path connecting the input-output terminal 42 and the antenna terminal 51 to each other, with the switch 63 interposed therebetween, the switch 63 being in the conducting state.

Second Connection State

Figures 3, 4:
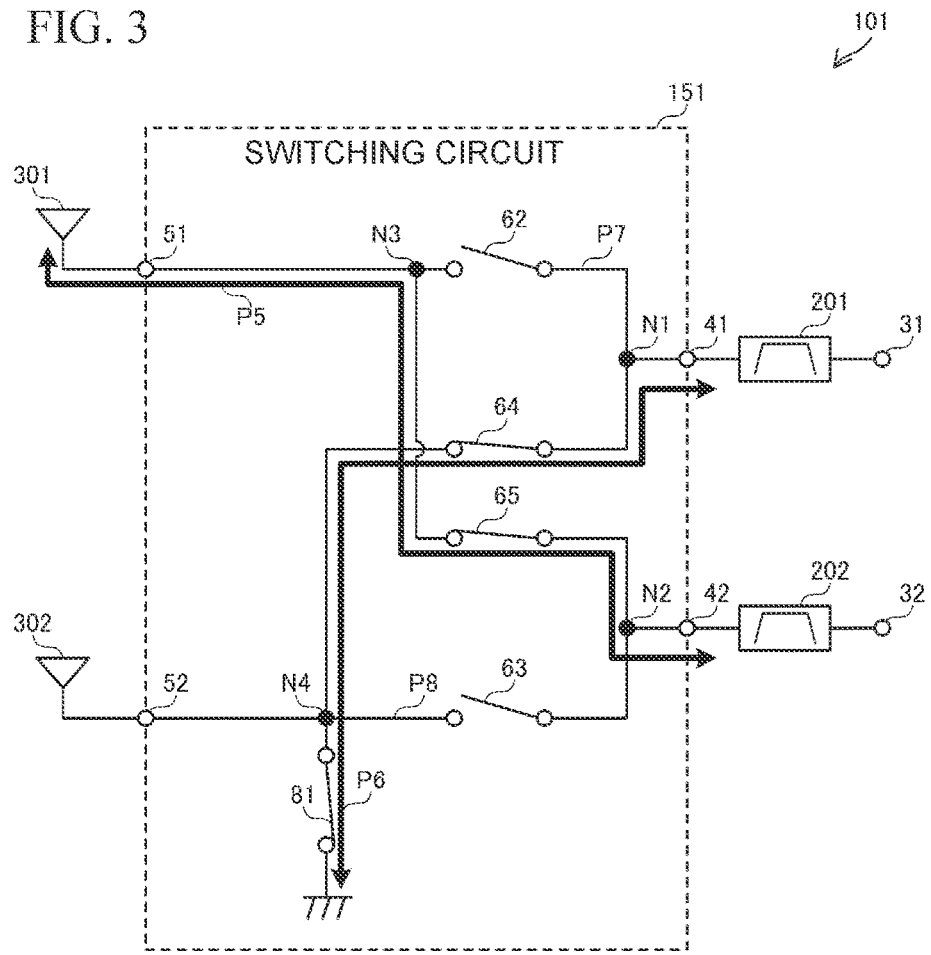
FIG. 3 is a circuit diagram of the front end circuit 101, which is in a second connection state.
FIG. 4 is a logic table LT2 illustrating states of the individual switches of the switching circuit 151 in the second connection state.

FIG. 3 is a circuit diagram of the front end circuit 101, which is in a second connection state. FIG. 4 is a logic table LT2 illustrating states of the individual switches of the switching circuit 151 in the second connection state and states of the individual switches of the switching circuit according to the first comparative example in the second connection state. As illustrated in FIGS. 3 and 4, in the second connection state, the electrical connection destination of the input-output terminal 42 is switched to the antenna terminal 51, and the electrical connection destination of the input-output terminal 41 is switched to ground.

Specifically, in the second connection state, a first path switch provided along a path P5 (the first path) connecting the input-output terminal 42 and the antenna terminal 51 to each other, and a second path switch and the ground switch 81 provided along a path P6 (the second path) connecting the input-output terminal 41 and ground to each other are in conducting states, and third path switches provided along a path P7 (the third path) and a path P8 (the third path), which connect the path P5 and the path P6 to each other, are in non-conducting states.

In this case, the path P5 is a path extending from the input-output terminal 42 to the antenna terminal 51 through the nodes N2 and N3. The path P6 is a path extending from the input-output terminal 41 to ground through the nodes N1 and N4. The path P7 is a path extending from the node N1 to the node N3 through the switch 62. The path P8 is a path extending from the node N2 to the node N4 through the switch 63.

Along the path P5, data signals are transferred. The first path switch and the second path switch are the switches 65 and 64, respectively. The third path switches are the switches 62 and 63.

In the second connection state, the first end of the ground switch 81 is electrically connected to the input-output terminal 41 through the switch 64, which is one of the switches 62, 63, 64, and 65. Moreover, the first end of the ground switch 81 is not directly connected to the path P5 or the path connecting the input-output terminal 41 and the antenna terminal 51 to each other. Specifically, the first end of the ground switch 81 is indirectly connected to the path P5 through the switch 63, which is in the non-conducting state. Moreover, the first end of the ground switch 81 is indirectly connected to the path connecting the input-output terminal 41 and the antenna terminal 51 to each other, with the switch 64 interposed therebetween, the switch 64 being in the conducting state.

Third Connection State

Figure 5:
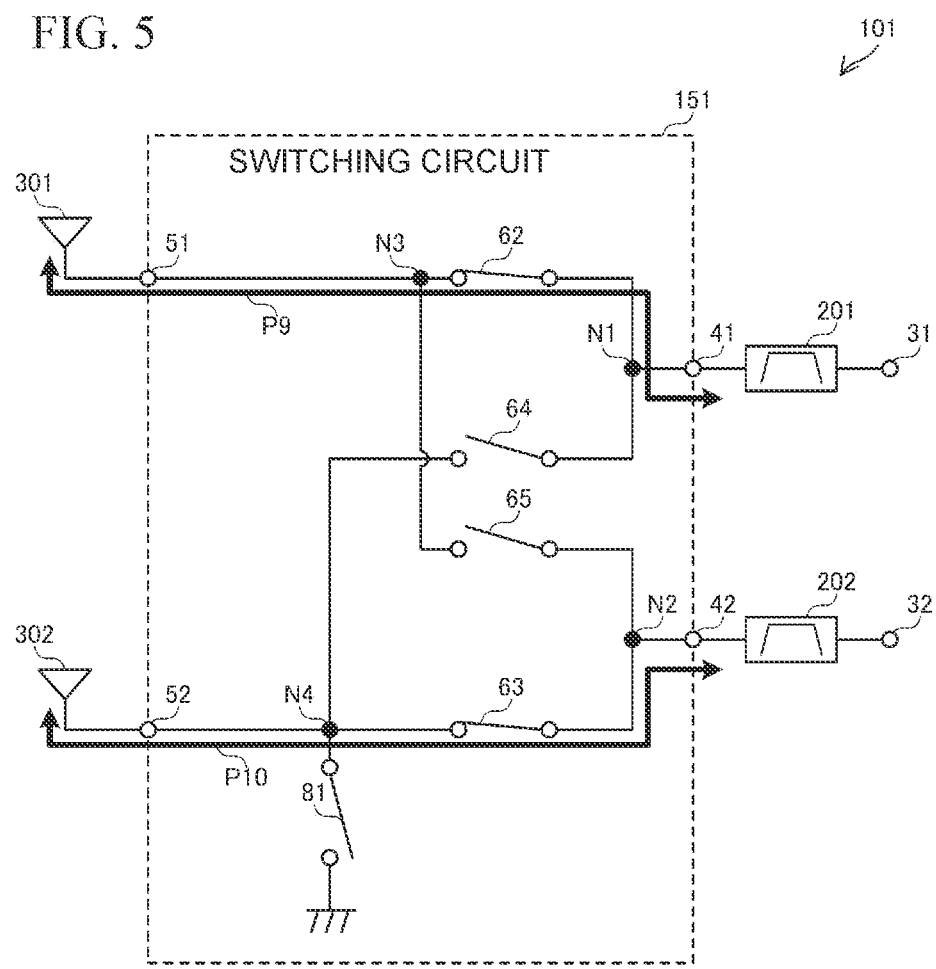
FIG. 5 is a circuit diagram of the front end circuit 101, which is in a third connection state.

FIG. 5 is a circuit diagram of the front end circuit 101, which is in a third connection state. As illustrated in FIG. 5, in the third connection state, the electrical connection destination of the input-output terminal 41 is switched to the antenna terminal 51, and the electrical connection destination of the input-output terminal 42 is switched to the antenna terminal 52.

Specifically, in the third connection state, the switches 62 and 63 are in conducting states. The switches 64 and 65 and the ground switch 81 are in non-conducting states.

Signals to be transmitted by and signals received by the main antenna 301 are transferred along a path P9. Signals to be transmitted by and signals received by the diversity antenna 302 are transferred along a path P10.

In this case, the path P9 is a path extending from the input-output terminal 41 to the antenna terminal 51 through the node N1, the switch 62, and the node N3. The path P10 is a path extending from the input-output terminal 42 to the antenna terminal 52 through the node N2, the switch 63, and the node N4.

Along the path P9, data signals are transferred. Along the path P10, sounding reference signals are transferred.

Fourth Connection State

Figure 6:
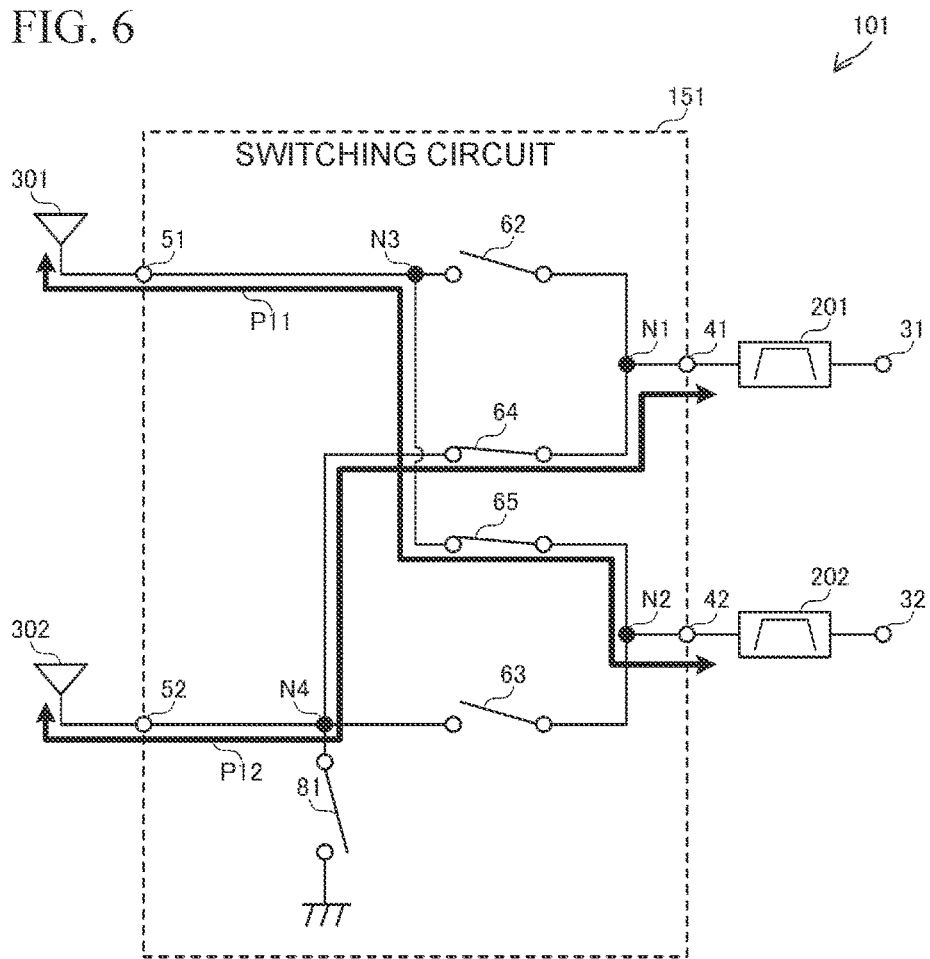
FIG. 6 is a circuit diagram of the front end circuit 101, which is in a fourth connection state.

FIG. 6 is a circuit diagram of the front end circuit 101, which is in a fourth connection state. As illustrated in FIG. 6, in the fourth connection state, the electrical connection destination of the input-output terminal 41 is switched to the antenna terminal 52, and the electrical connection destination of the input-output terminal 42 is switched to the antenna terminal 51.

Specifically, in the fourth connection state, the switches 64 and 65 are in conducting states. The switches 62 and 63 and the ground switch 81 are in non-conducting states.

Signals to be transmitted by and signals received by the main antenna 301 are transferred along a path P11. Signals to be transmitted by and signals received by the diversity antenna 302 are transferred along a path P12.

In this case, the path P11 is a path extending from the input-output terminal 42 to the antenna terminal 51 through the node N2, the switch 65, and the node N3. The path P12 is a path extending from the input-output terminal 41 to the antenna terminal 52 through the node N1, the switch 64, and the node N4.

Along the path P11, data signals are transferred. Along the path P12, sounding reference signals are transferred.

In a case where the switching circuit 151 is controlled in accordance with "logic of switching circuit according to first comparative example" in the logic table LT1 (see FIG. 2), the switch 62 is in the conducting state, and the switches 63, 64, and 65 and the ground switch 81 are in the non-conducting states.

In a case where the switch 65 is in the non-conducting state, the node N3 and the node N2 are not electrically connected to each other; however, a RF signal flows through the switch 65 to a certain degree due to the parasitic capacitance of the switch 65. Thus, in a case where a transmission signal input to the terminal 31 is transferred to the main antenna 301 along the path P1, part of the transmission signal is transferred from the node N3 to the input-output terminal 42 along the path P4.

In "logic of switching circuit according to first comparative example", the switch 63 and the ground switch 81 are in the non-conducting states, and thus the input-output terminal 42 cannot be electrically sufficiently isolated from the path P1, and transfer of a transmission signal to the input-output terminal 42 along the path P4 cannot be suppressed. That is, it is difficult to ensure a sufficient level of isolation between the input-output terminals 41 and 42.

In a case where the switching circuit 151 is controlled in accordance with "logic of switching circuit according to first comparative example" in the logic table LT2 (see FIG. 4), the switch 65 is in the conducting state, and the switches 62, 63, and 64 and the ground switch 81 are in the non-conducting states.

In this case, when a transmission signal input to the terminal 32 is transferred to the main antenna 301 along the path P5, part of the transmission signal is transferred from the node N3 to the input-output terminal 41 along the path P7.

In "logic of switching circuit according to first comparative example", the switch 64 and the ground switch 81 are in the non-conducting states, and thus the input-output terminal 41 cannot be electrically sufficiently isolated from the path P5, and transfer of a transmission signal to the input-output terminal 41 along the path P7 cannot be suppressed. That is, it is difficult to ensure a sufficient level of isolation between the input-output terminals 41 and 42.

Figure 7:
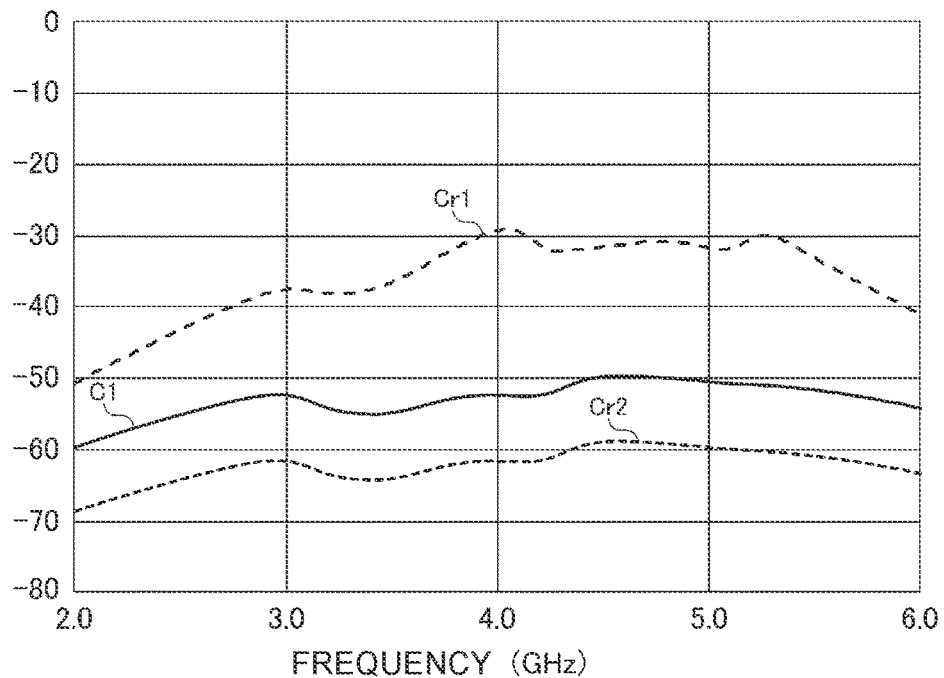
FIG. 7 is a diagram illustrating an example of changes in the level of isolation between input-output terminals 41 and 42 with respect to frequency.

FIG. 7 is a diagram illustrating an example of changes in the level of isolation between the input-output terminals 41 and 42 with respect to frequency. Note that, in FIG. 7, the horizontal axis represents frequency in units of "GHz", and the vertical axis represents the level of isolation in units of "dB".

As illustrated in FIG. 7, a curve Cr1 represents changes in the level of isolation with respect to frequency in a case where the switching circuit is not provided with the ground switch 81. Note that changes in the level of isolation with respect to frequency in a case where the switching circuit 151 is controlled in accordance with "logic of switching circuit according to first comparative example" illustrated in the logic tables LT1 (see FIG. 2) and LT2 (see FIG. 4) are also substantially the same as those represented by the curve Cr1.

A curve C1 represents changes in the level of isolation with respect to frequency in a case where the switching circuit 151 is controlled in accordance with "logic of switching circuit 151" illustrated in the logic tables LT1 and LT2. The level of isolation represented by the curve C1 is significantly improved from that represented by the curve Cr1 in a wide frequency band from 2 GHz to 6 GHz. That is, a configuration in which the switching circuit 151 is controlled in accordance with "logic of switching circuit 151" illustrated in the logic tables LT1 and LT2 enables a sufficient level of isolation between the input-output terminals 41 and 42 to be ensured.

A curve Cr2 represents changes in the level of isolation with respect to frequency in a case where two shunt switches are provided between the input-output terminal 41 and ground, and two shunt switches are provided between the input-output terminal 42 and ground. Although the level of isolation represented by the curve Cr2 is improved from that represented by the curve C1, two more shunt switches are provided than in the switching circuit 151, thereby resulting in a larger circuit scale. In contrast, in the switching circuit 151, the level of isolation represented by the curve C1, which is close to that represented by the curve Cr2, can be realized while reducing the circuit scale.

Note that the ground switch 81 is not always necessarily in the conducting state in a case where the input-output terminal 41 is connected to the antenna terminal 51 or in a case where the input-output terminal 42 is connected to the antenna terminal 51. Specifically, the ground switch 81 is not in the conducting state in a case where, as illustrated in the third connection state, the input-output terminal 41 is connected to the antenna terminal 51, and the input-output terminal 42 is connected to the antenna terminal 52, and in a case where, as illustrated in the fourth connection state, the input-output terminal 42 is connected to the antenna terminal 51, and the input-output terminal 41 is connected to the antenna terminal 52. In this manner, in the present disclosure, if there is a case where the ground switch 81 is in the conducting state in a case where the input-output terminal 41 is connected to the antenna terminal 51 or in a case where the input-output terminal 42 is connected to the antenna terminal 51, an effect can be realized that a sufficient level of isolation between the input-output terminals 41 and 42 is ensured.

Second Embodiment

Filter characteristics of the filter circuits 201 and 202 according to a second embodiment will be described. Description of matters common to those of the first embodiment will be omitted in the second and subsequent embodiments, and only different points will be described. In particular, substantially the same operational effects due to substantially the same configurations will not be mentioned in each embodiment.

Figure 8:
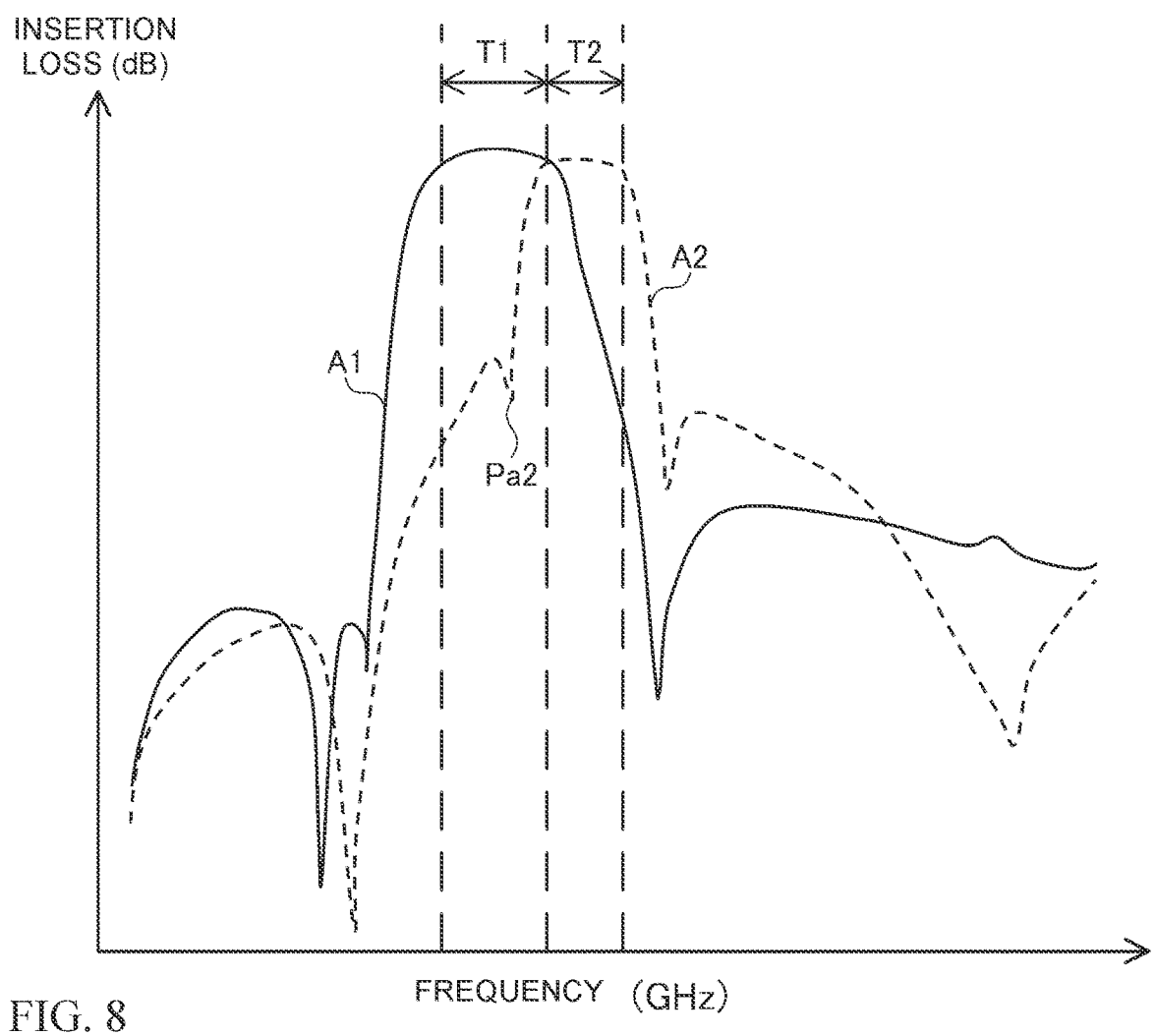
FIG. 8 is a diagram illustrating an example of attenuation characteristics of filter circuits 201 and 202.

FIG. 8 is a diagram illustrating an example of attenuation characteristics of the filter circuits 201 and 202. Note that, in FIG. 8, the horizontal axis represents frequency in units of "GHz", and the vertical axis represents insertion loss in units of "dB".

As illustrated in FIG. 8, a curve A1 represents changes in the insertion loss of the filter circuit 201 with respect to frequency, and a curve A2 represents changes in the insertion loss of the filter circuit 202 with respect to frequency. A pass band T1 of the filter circuit 201 differs from a pass band T2 of the filter circuit 202. The frequency of an attenuation pole Pa2 of the filter circuit 202 is included in the pass band T1 of the filter circuit 201.

If a sufficient level of isolation is not ensured between the input-output terminals 41 and 42, the attenuation pole Pa2 may appear as resonance in the pass band T1 of the filter circuit 201. This case is not necessarily suitable because signals having frequencies near the frequency of the attenuation pole Pa2 and included in the pass band T1 are attenuated, and transfer loss increases in the filter circuit 201.

In contrast, a sufficient level of isolation can be ensured between the input-output terminals 41 and 42 in the front end circuit 101. Thus, in a case where the frequency of the attenuation pole Pa2 of the filter circuit 202 is included in the pass band T1 of the filter circuit 201, an increase in transfer loss due to attenuation of signals having frequencies near the frequency of the attenuation pole Pa2 can be suppressed.

Third Embodiment

Figure 9:
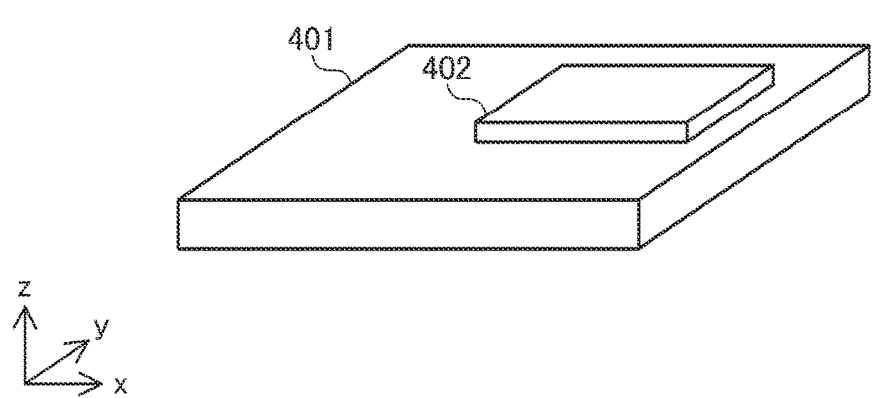
FIG. 9 is a diagram illustrating an example of a layout of a multilayer substrate 401 and a semiconductor chip 402.

A multilayer substrate and a semiconductor chip according to a third embodiment will be described. FIG. 9 is a diagram illustrating an example of a layout of a multilayer substrate 401 and a semiconductor chip 402. As illustrated in FIG. 9, the multilayer substrate 401 is a substrate obtained by stacking a plurality of layers in the z axis direction. The semiconductor chip 402 is provided on the positive z axis side of the multilayer substrate 401.

The switching circuit 151 and the filter circuits 201 and 202 are formed in the semiconductor chip 402. Note that the filter circuits 201 and 202 may be formed in or on the multilayer substrate 401.

Figure 10:
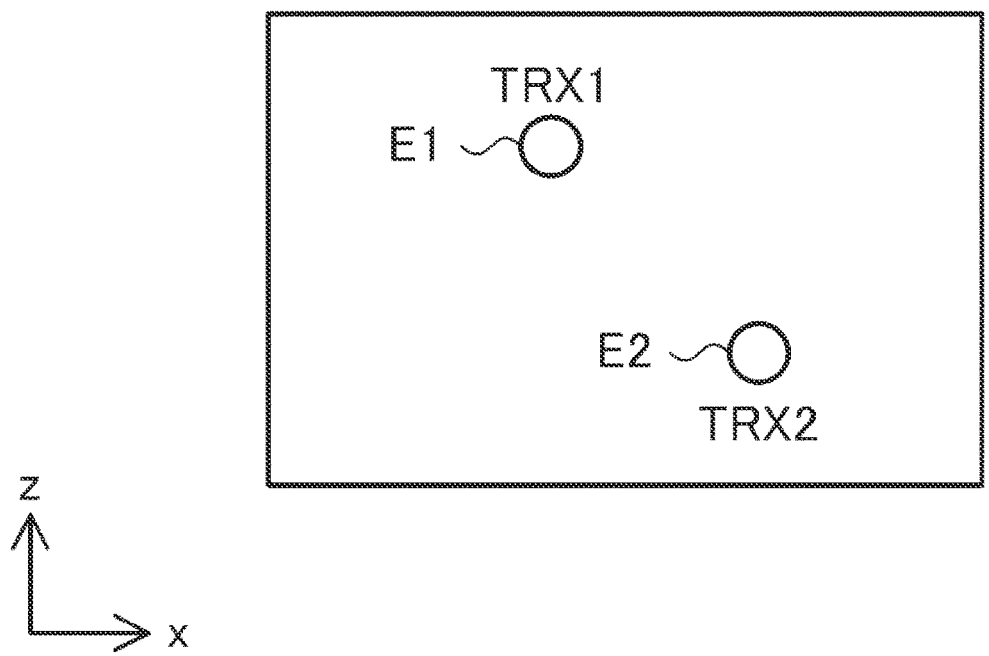
FIG. 10 is a cross-sectional view parallel to the zx surface of the multilayer substrate 401.

FIG. 10 is a cross-sectional view parallel to the zx surface of the multilayer substrate 401. As illustrated in FIG. 10, in a case where a wiring line E1 along which a transmission-reception signal TRX1 is transferred and a wiring line E2 along which a transmission-reception signal TRX2 is transferred are provided close to each other, unexpected electrical coupling may occur between the wiring line E1 and the wiring line E2. That is, a sufficient level of isolation is not ensured between the wiring line E1 and the wiring line E2.

In contrast, in a case where the wiring line E1 and the wiring line E2 are provided close to each other in the front end circuit 101, even when unexpected electrical coupling occurs between the wiring line E1 and the wiring line E2, a sufficient level of isolation can be ensured between the input-output terminals 41 and 42.

Fourth Embodiment

Figure 11:
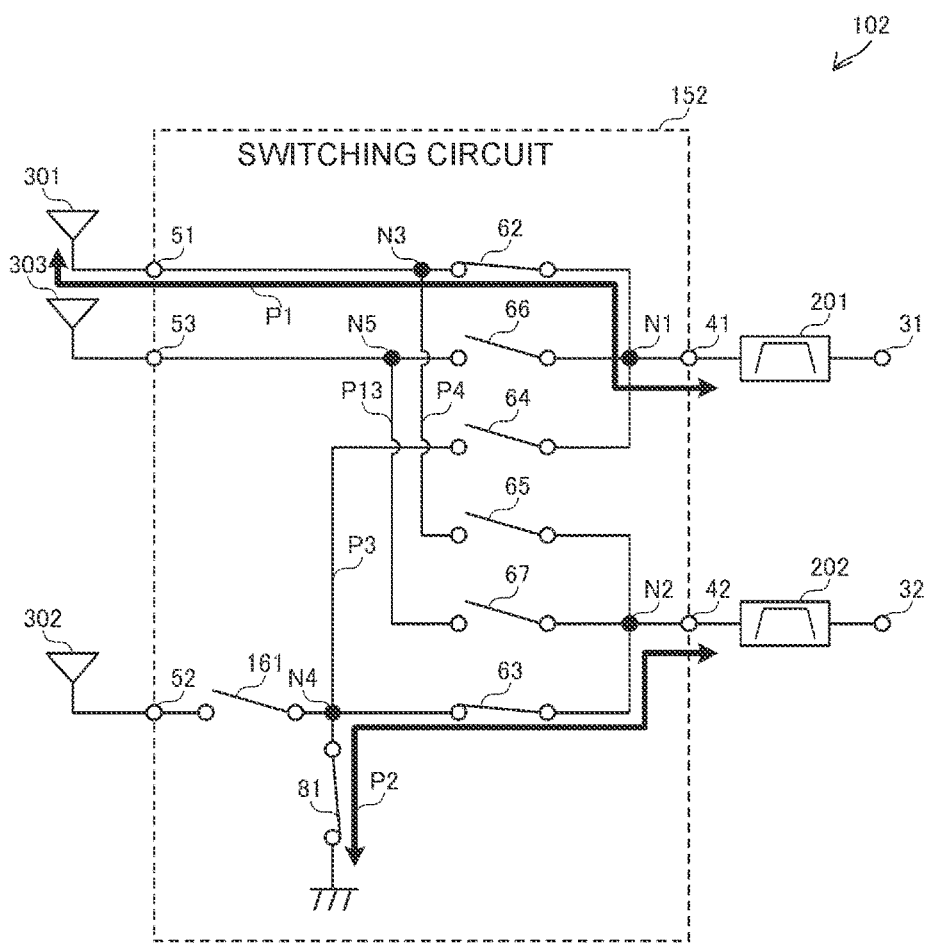
FIG. 11 is a circuit diagram of a front end circuit 102, which is in a fifth connection state.

A front end circuit 102 according to a fourth embodiment will be described. FIG. 11 is a circuit diagram of the front end circuit 102, which is in a fifth connection state. As illustrated in FIG. 11, the front end circuit 102 according to the fourth embodiment differs from the front end circuit 101 according to the first embodiment in that the front end circuit 102 according to the fourth embodiment is provided with three antenna terminals.

Compared with the front end circuit 101 illustrated in FIG. 1, the front end circuit 102 has a switching circuit 152 instead of the switching circuit 151. Compared with the switching circuit 151 illustrated in FIG. 1, the switching circuit 152 further includes an antenna terminal 53 (a third antenna terminal), a switch 66 (a sixth switch), a switch 67 (a seventh switch), and a switch 161 (a first switch).

The switches 62, 63, 64, 65, 66, and 67 of the switching circuit 152 can switch the electrical connection destination of the input-output terminal 41 also to the antenna terminal 53 and can switch the electrical connection destination of the input-output terminal 42 also to the antenna terminal 53.

Specifically, the switch 66 is provided between the antenna terminal 53 and the input-output terminal 41. The switch 67 is provided between the antenna terminal 53 and the input-output terminal 42.

More specifically, the switch 66 has a first end connected to the antenna terminal 53 with a node N5 interposed therebetween, and a second end connected to the input-output terminal 41 with the node N1 interposed therebetween. The switch 67 has a first end connected to the node N5, and a second end connected to the input-output terminal 42 with the node N2 interposed therebetween.

The switch 161 has a first end connected to the antenna terminal 52 (the second antenna terminal), and a second end connected to the node N4 along the path P2.

Fifth Connection State

FIG. 12 is a logic table LT3 illustrating states of the individual switches of the switching circuit 152 in the fifth connection state and states of individual switches of a switching circuit according to a second comparative example in the fifth connection state. In this case, the switching circuit according to the second comparative example has substantially the same circuit configuration as the switching circuit 152; however, the switching circuit according to the second comparative example is a circuit controlled using logic for controlling the states of the individual switches to be in different states from the individual switches of the switching circuit 152. As illustrated in FIGS. 11 and 12, in the fifth connection state, the switch 62 (the first path switch), which is provided along the path P1 (the first path), is in a conducting state, the path P1 extending from the input-output terminal 41 to the antenna terminal 51 through the nodes N1 and N3.

The switch 63 (the second path switch) and the ground switch 81, which are provided along the path P2 (the second path), are in conducting states, the path P2 extending from the input-output terminal 42 to ground through the nodes N2 and N4. The third path switches provided along the path P3 (the third path), the path P4 (the third path), and a path P13 (the third path) are in non-conducting states, the paths P3, P4, and P13 connecting the path P1 and the path P2 to each other.

In this case, the path P13 is a path extending from the node N2 to the node N1 through the switch 67, the node N5, and the switch 66. The third path switches are the switches 64, 65, 66, and 67.

In a case where the switching circuit 152 is controlled in accordance with "logic of switching circuit according to second comparative example" in the logic table LT3 (see FIG. 12), the switch 63 and the ground switch 81 are in non-conducting states. In this case, when a transmission signal input to the terminal 31 is transferred to the main antenna 301 along the path P1, part of the transmission signal is transferred from the node N3 to the input-output terminal 42 along the path P4 mainly due to the parasitic capacitance of the switch 65.

In "logic of switching circuit according to second comparative example", the switch 63 and the ground switch 81 are in the non-conducting states, and thus the input-output terminal 42 cannot be electrically sufficiently isolated from the path P1, and transfer of a transmission signal to the input-output terminal 42 along the path P4 cannot be suppressed. That is, it is difficult to ensure a sufficient level of isolation between the input-output terminals 41 and 42.

In contrast, in a case where the switching circuit 152 is controlled in accordance with "logic of switching circuit 152", the switch 63 and the ground switch 81 are in the conducting states, and thus the input-output terminal 42 can be electrically grounded. As a result, a sufficient level of isolation between the input-output terminals 41 and 42 can be ensured.

Sixth Connection State

FIG. 13 is a circuit diagram of the front end circuit 102, which is in a sixth connection state. FIG. 14 is a logic table LT4 illustrating states of the individual switches of the switching circuit 152 in the sixth connection state and states of the individual switches of the switching circuit according to the second comparative example in the sixth connection state. As illustrated in FIGS. 13 and 14, in the sixth connection state, the switch 65 (the first path switch), which is provided along the path P5 (the first path) is in a conducting state, the path P5 extending from the input-output terminal 42 to the antenna terminal 51 through the nodes N2 and N3.

The switch 64 (the second path switch) and the ground switch 81, which are provided along the path P6 (the second path), are in conducting states, the path P6 extending from the input-output terminal 41 to ground through the nodes N1 and N4. The switch 62 provided along the path P7 (the third path), the switch 63 provided along the path P8 (the third path), and the switches 66 and 67 provided along the path P13 (the third path) are the third path switches. The third path switches are in non-conducting states.

In a case where the switching circuit 152 is controlled in accordance with "logic of switching circuit according to second comparative example" in the logic table LT4 (see FIG. 14), the switch 64 and the ground switch 81 are in non-conducting states. In this case, when a transmission signal input to the terminal 32 is transferred to the main antenna 301 along the path P5, part of the transmission signal is transferred from the node N3 to the input-output terminal 41 along the path P7 mainly due to the parasitic capacitance of the switch 62.

In "logic of switching circuit according to second comparative example", the switch 64 and the ground switch 81 are in the non-conducting states, and thus the input-output terminal 41 cannot be electrically sufficiently isolated from the path P5, and transfer of a transmission signal to the input-output terminal 41 along the path P7 cannot be suppressed. That is, it is difficult to ensure a sufficient level of isolation between the input-output terminals 41 and 42.

In contrast, in a case where the switching circuit 152 is controlled in accordance with "logic of switching circuit 152", the switch 64 and the ground switch 81 are in the conducting states, and thus the input-output terminal 41 can be electrically grounded. As a result, a sufficient level of isolation between the input-output terminals 41 and 42 can be ensured.

Fifth Embodiment

Figure 15:
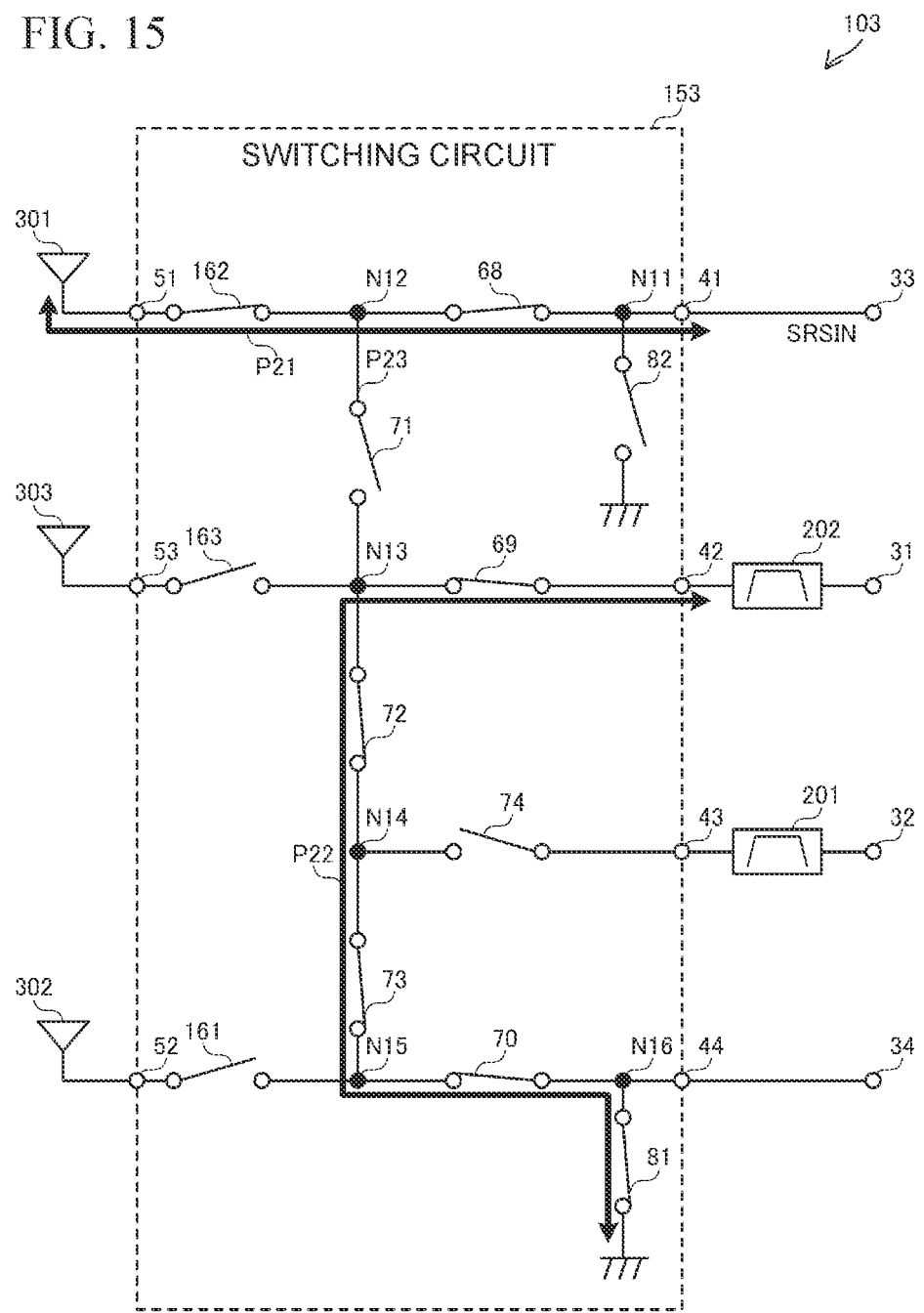
FIG. 15 is a circuit diagram of a front end circuit 103, which is in a seventh connection state.

A front end circuit 103 according to a fifth embodiment will be described. FIG. 15 is a circuit diagram of the front end circuit 103, which is in a seventh connection state. As illustrated in FIG. 15, the front end circuit 103 according to the fifth embodiment differs from the front end circuit 102 according to the fourth embodiment in that the front end circuit 103 according to the fifth embodiment is provided with four input-output terminals.

Compared with the front end circuit 102 illustrated in FIG. 11, the front end circuit 103 has a switching circuit 153 instead of the switching circuit 152. The switching circuit 153 includes the input-output terminal 41 (the first input-output terminal), the input-output terminal 42 (the second input-output terminal), an input-output terminal 43 (a third input-output terminal), and an input-output terminal 44 (a fourth input-output terminal), the antenna terminal 51 (the first antenna terminal), the antenna terminal 52 (the second antenna terminal), and the antenna terminal 53 (the third antenna terminal), a switch 68 (an eighth switch), a switch 69 (a ninth switch), a switch 70 (a tenth switch), a switch 71 (an eleventh switch), a switch 72 (a twelfth switch), a switch 73 (a thirteenth switch), a switch 74 (a fourteenth switch), the switch 161 (the first switch), switches 162 and 163, the ground switch 81, and a ground switch 82.

The switches 68 to 74 and 161 to 163 of the switching circuit 153 can switch the electrical connection destination of each of the input-output terminals 41, 42, 43, and 44 to any one of the antenna terminals 51, 52, and 53, and are provided such that any two input-output terminals out of the input-output terminals 41, 42, 43, and 44 can be electrically connected to each other.

Specifically, the switch 161 has a first end connected to the antenna terminal 52, and a second end. The switch 162 has a first end connected to the antenna terminal 51, and a second end. The switch 163 has a first end connected to the antenna terminal 53, and a second end.

The switch 68 has a first end connected to the second end of the switch 162 with the node N12 interposed therebetween, and a second end connected to the input-output terminal 41 with the node N11 interposed therebetween. The switch 69 has a first end connected to the second end of the switch 163 with the node N13 interposed therebetween, and a second end connected to the input-output terminal 42. The switch 70 has a first end connected to the second end of the switch 161 with the node N15 interposed therebetween, and a second end connected to the input-output terminal 44 with the node N16 interposed therebetween.

The switch 71 has a first end connected to the node N12, and a second end connected to the node N13. The switch 72 has a first end connected to the node N13, and a second end connected to the node N14. The switch 73 has a first end connected to the node N14, and a second end connected to the node N15. The switch 74 has a first end connected to the node N14, and a second end connected to the input-output terminal 43.

The ground switch 81 has a first end connected to the node N16, and a second end connected to ground. The ground switch 82 has a first end connected to the node N11, and a second end connected to ground.

Seventh Connection State

FIG. 16 is a logic table LT5 illustrating states of the individual switches of the switching circuit 153 in the seventh connection state and states of individual switches of a switching circuit according to a third comparative example in the seventh connection state. In this case, the switching circuit according to the third comparative example has substantially the same circuit configuration as the switching circuit 153; however, the switching circuit according to the third comparative example is a circuit controlled using logic for controlling the states of the individual switches to be in different states from the individual switches of the switching circuit 153. As illustrated in FIGS. 15 and 16, in the seventh connection state, the electrical connection destination of the input-output terminal 41 is switched to the antenna terminal 51, and the electrical connection destination of the input-output terminal 42 is switched to ground.

Specifically, in the seventh connection state, first path switches provided along the path P21 (the first path) connecting the input-output terminal 41 and the antenna terminal 51 to each other, and second path switches and the ground switch 81 provided along the path P22 (the second path) connecting the input-output terminal 42 and ground to each other are in conducting states. A third path switch, the ground switch 82, and the switches 74, 161, and 163 are in non-conducting states, the third path switch being provided along the path P23 (the third path) connecting the path P21 and the path P22 to each other. Note that the switch 74 may be in a conducting state.

In this case, the path P21 is a path extending from the input-output terminal 41 to the antenna terminal 51 through the nodes N11 and N12. The path P22 is a path extending from the input-output terminal 42 to ground through the nodes N13, N14, N15, and N16. The path P23 is a path extending from the node N12 to the node N13.

The first path switches are the switches 68 and 162. The second path switches are the switches 69, 72, 73, and 70. The third path switch is the switch 71.

In a case where the switching circuit 153 is controlled in accordance with "logic of switching circuit according to third comparative example" in the logic table LT5 (see FIG. 16), the switches 69, 74, 73, 70, and 72 are in non-conducting states. In this case, when a sounding reference signal input to a terminal 33 is transferred to the main antenna 301 along the path P21, part of the sounding reference signal is transferred from the node N12 to the input-output terminal 42 through the switches 71 and 69 due to the parasitic capacitances of the switches 71 and 69.

In "logic of switching circuit according to third comparative example", the switches 69, 72, 73, and 70 are in the non-conducting states, and thus the input-output terminal 42 cannot be electrically sufficiently isolated from the path P21, and transfer of a transmission signal to the input-output terminal 42 through the switches 71 and 69 cannot be suppressed. That is, it is difficult to ensure a sufficient level of isolation between the input-output terminals 41 and 42.

In contrast, in a case where the switching circuit 153 is controlled in accordance with "logic of switching circuit 153", the switches 69, 72, 73, and 70 are in conducting states, and thus the input-output terminal 42 can be electrically grounded. As a result, a sufficient level of isolation between the input-output terminals 41 and 42 can be ensured.

Note that the switching circuit 151 has been described so as to have a configuration in which the antenna terminal 52 and the node N4 are directly connected to each other; however, the configuration of the switching circuit 151 is not limited thereto. The switching circuit 151 may have a configuration in which the switch 161 is provided between the antenna terminal 52 and the node N4.

The switching circuits 152 and 153 have been described so as to have configurations including the antenna terminals 51, 52, and 53; however, the configurations of the switching circuits 152 and 153 are not limited thereto. The switching circuit 152 may have a configuration including four or more antenna terminals. In this case, for example, at least two terminals out of the four or more terminals are connected to the main antenna, and at least one terminal out of the four or more terminals is connected to the diversity antenna.

Exemplary embodiments of the present disclosure have been described above. The switching circuits 151, 152, and 153 include the antenna terminals 51 and 52, the input-output terminals 41 and 42, the plurality of switches, and the ground switch 81. The plurality of switches can switch the electrical connection destination of the input-output terminal 41 to either one of the antenna terminals 51 and 52, can switch the electrical connection destination of the input-output terminal 42 to either one of the antenna terminals 51 and 52, and are provided such that the input-output terminal 41 and the input-output terminal 42 can be electrically connected to each other. The ground switch 81 has a first end electrically connected to the input-output terminal 42 through one or more of the plurality of switches, and has a second end connected to ground. When the electrical connection destination of the input-output terminal 41 is switched to the antenna terminal 51, the first path switch included in the plurality of switches and provided along the first path connecting the input-output terminal 41 and the antenna terminal 51 to each other, and the second path switch and the ground switch 81 provided along the second path connecting the input-output terminal 42 and ground to each other, the second path switch being included in the plurality of switches, are in the conducting states, and the third path switches included in the plurality of switches and provided along the third path connecting the first path and the second path to each other are in the non-conducting states.

In a case where the plurality of switches are provided such that the input-output terminal 41 and the input-output terminal 42 can be electrically connected to each other, even when a switch provided along a path connecting the input-output terminal 41 and the input-output terminal 42 to each other is in a non-conducting state, it is difficult to electrically sufficiently isolate the input-output terminal 41 and the input-output terminal 42 from each other due to the parasitic capacitance of the switch. In contrast, as described above, with the configuration in which the first path switch provided along the first path is in the conducting state, an RF signal can be transferred between the input-output terminal 41 and the antenna terminal 51. With the configuration in which the second path switch and the ground switch 81 provided along the second path are in the conducting states, the input-output terminal 42 can be electrically connected to ground. This can suppress an RF signal, which is transferred along the first path, flowing into the second path through the third path switches, and thus a sufficient level of isolation between the input-output terminals 41 and 42 can be ensured. Moreover, with the configuration in which the ground switch 81 is indirectly connected to the input-output terminals 41 and 42 with the second path switch interposed therebetween, a reduction in power of a transferred signal due to the ground switch 81 can be suppressed in the first path and the path connecting the input-output terminal 42 and the antenna terminal 51 to each other. Thus, transmission signals having high power can be transferred in these paths. Such isolation can be ensured and realized by one ground switch 81, and thus the circuit scales of the switching circuits 151, 152, and 153 can be reduced. Thus, a reduction in isolation characteristics can be suppressed with a small circuit scale.

The switching circuit 152 further includes the antenna terminal 53, and the plurality of switches can switch the electrical connection destination of the input-output terminal 41 also to the antenna terminal 53 and can switch the electrical connection destination of the input-output terminal 42 also to the antenna terminal 53.

Such a configuration enables a sufficient level of isolation between the input-output terminals 41 and 42 to be ensured with a small circuit scale even in a case where the electrical connection destination of the input-output terminal 41 can be switched to any one of the antenna terminals 51, 52, and 53, and the electrical connection destination of the input-output terminal 42 can be switched to any one of the antenna terminals 51, 52, and 53.

Moreover, in the switching circuits 151, 152, and 153, the plurality of switches include the switch 161 having a first end connected to the antenna terminal 52 and a second end connected to the second path.

With such a configuration, electrical connection and disconnection between the diversity antenna 302 connected to the antenna terminal 52 and the second path can be switched. Moreover, for example, even in a case where the distance between the diversity antenna 302 and the main antenna 301 or 303 is short, and these are electrically coupled to each other, a reduction in the level of isolation between the input-output terminals 41 and 42 due to such coupling can be suppressed by causing the switch 161 to be in the non-conducting state.

Moreover, in the switching circuits 151, 152, and 153, a time period in which radio waves are transmitted through the antenna terminal 52 is shorter than a time period in which radio waves are transmitted through the antenna terminal 51.

With such a configuration, a path along which a data signal whose transmission time is generally long is transferred can be separated from a path along which a signal whose transmission time is short such as a sounding reference signal is transferred. Specifically, for example, the first path and the path connecting the input-output terminal 42 to the antenna terminal 51 can be treated as paths along which data signals are transferred, and the path connecting the input-output terminal 41 and the antenna terminal 52 to each other and the path connecting the input-output terminal 42 and the antenna terminal 52 to each other can be treated as paths along which sounding reference signals are transferred. As a result, for example, in a case where a ground switch 81 is directly connected to a path along which a data signal having high power is transferred, a ground switch 81 that has a large size and that causes small distortion in signals is desired; however, since the ground switch 81 does not have to be directly connected to the path, the ground switch 81 can be simplified. Moreover, the ground switch 81 can be provided along a path along which a signal having relatively low power is transferred, and thus insertion loss due to provision of the ground switch 81 can be easily reduced.

Moreover, in the switching circuits 151, 152, and 153, the first end of the ground switch 81 is not directly connected to the first path or the path connecting the input-output terminal 42 and the antenna terminal 51 to each other.

With such a configuration, a reduction in power of a transferred signal due to the ground switch 81 can be more assuredly suppressed in the first path and the path connecting the input-output terminal 42 and the antenna terminal 51 to each other, and thus transmission signals having high power can be transferred in these paths.

Moreover, in the switching circuits 151, 152, and 153, a sounding reference signal is transferred along the path connecting the input-output terminal 41 or 42 and the antenna terminal 52 to each other.

In order to transfer a sounding reference signal through the above-described path, many switches are provided. When the circuit scale is further reduced, terminals may become close to each other. In contrast, when terminals are close to each other, it is difficult to ensure isolation between the terminals, and thus satisfying both size reduction and assurance of isolation becomes an issue. In contrast, a sufficient level of isolation between the input-output terminals 41 and 42 can be ensured in the switching circuits 151, 152, and 153, and thus both size reduction and assurance of isolation can be satisfied even when a configuration is used in which many switches are provided to transfer a sounding reference signal.

Moreover, in the switching circuit 151, the plurality of switches include the switches 62 to 65. The switch 62 is provided between the antenna terminal 51 and the input-output terminal 41 and is the first path switch. The switch 63 is provided between the antenna terminal 52 and the input-output terminal 42 and is the second path switch. The switch 64 is provided between the antenna terminal 52 and the input-output terminal 41 and is the third path switch. The switch 65 is provided between the antenna terminal 51 and the input-output terminal 42 and is the third path switch. The first end of the ground switch 81 is electrically connected to the input-output terminal 42 through the switch 63.

In this manner, a simple circuit configuration including four switches and one ground switch 81 enables a reduction in isolation characteristics to be suppressed with a small circuit scale. Moreover, with a configuration in which the ground switch 81 is electrically connected to the input-output terminal 42 through the switch 63, and the ground switch 81 is connected to the input-output terminal 41 with the switch 64 interposed therebetween, transmission signals having high power can be transferred in the path connecting the antenna terminal 51 and the input-output terminal 41 to each other and the path connecting the antenna terminal 51 and the input-output terminal 42 to each other.

Moreover, the switching circuit 152 further includes the antenna terminal 53. The plurality of switches further include the switch 66 provided between the antenna terminal 53 and the input-output terminal 41, and the switch 67 provided between the antenna terminal 53 and the input-output terminal 42. When the switches 62 and 63 and the ground switch 81 are in the conducting states, the switches 64, 65, 66, and 67 are in the non-conducting states.

In this manner, a simple circuit configuration including six switches and one ground switch 81 enables a circuit to be realized in which the number of antenna terminals serving as electrical connection destinations of the input-output terminals 41 and 42 is increased by one.

Moreover, the switching circuit 153 further includes the antenna terminal 53 and the input-output terminals 43 and 44. The plurality of switches include the switches 68 to 74. The switch 68 is provided between the antenna terminal 51 and the input-output terminal 41 and is the first path switch. The switch 69 is provided between the antenna terminal 53 and the input-output terminal 42 and is the second path switch. The switch 70 is provided between the antenna terminal 52 and the input-output terminal 44 and is the second path switch. The switch 71 is provided between the antenna terminal 51 and the antenna terminal 53 and is the third path switch. The switch 72 has a first end connected to the antenna terminal 53, has a second end, and is the second path switch. The switch 73 has a first end connected to the second end of the switch 72, has a second end connected to the antenna terminal 52, and is the second path switch. The switch 74 has a first end connected to the second end of the switch 72 and has a second end connected to the input-output terminal 43. The first end of the ground switch 81 is electrically connected to the input-output terminal 42 through the switches 70, 73, 72, and 69.

Such a configuration enables a circuit to be realized that ensures, with a small circuit scale, a sufficient level of isolation between the input-output terminals 41 and 42, while connecting the electrical connection destination of each of the input-output terminals 41, 42, 43, and 44 to any one of the antenna terminals 51, 52, and 53.

Moreover, the front end circuits 101, 102, and 103 include the switching circuit 151, 152, or 153 and the filter circuit 202 connected to the input-output terminal 42.

Such a configuration enables the filter circuit 202 to attenuate a component of a transmission signal input to the input-output terminal 42, the component having a frequency for which it is desired to ensure isolation, and thus the level of isolation between the input-output terminals 41 and 42 can be improved regarding the transmission signal.

Moreover, the front end circuits 101 and 102 further include the filter circuit 201 connected to the input-output terminal 41.

Such a configuration enables the filter circuit 201 to attenuate a component of a transmission signal input to the input-output terminal 41, the component having a frequency for which it is desired to ensure isolation, and thus the level of isolation between the input-output terminals 41 and 42 can be improved regarding the transmission signal.

Moreover, in the front end circuits 101, 102, and 103, the pass band T2 of the filter circuit 202 differs from the pass band T1 of the filter circuit 201.

Such a configuration can reduce the power of a transmission signal input to the input-output terminal 42 and having a frequency that causes noise in a transmission signal input to the input-output terminal 41, and also reduce the power of a transmission signal input to the input-output terminal 41 and having a frequency that causes noise in a transmission signal input to the input-output terminal 42. As a result, the level of isolation between the input-output terminals 41 and 42 can be effectively improved.

Moreover, in the front end circuits 101 and 102, the frequency of the attenuation pole Pa2 of the filter circuit 202 is included in the pass band T1 of the filter circuit 201.

If a sufficient level of isolation is not ensured between the input-output terminals 41 and 42, the attenuation pole Pa2 may appear as resonance in the pass band T1 of the filter circuit 201. This case is not necessarily suitable because signals having frequencies near the frequency of the attenuation pole Pa2 and included in the pass band T1 are attenuated, and transfer loss increases in the filter circuit 201. In contrast, in the front end circuits 101, 102, and 103, a sufficient level of isolation can be ensured between the input-output terminal 42 and the input-output terminal 41 or 43, and thus degradation of the bandpass characteristics of the filter circuit 201 can be suppressed.

Note that the individual embodiments described above are embodiments for facilitating understanding of the present disclosure and are not intended to limit the interpretation of the present disclosure. The present disclosure can be changed/improved without necessarily departing from the gist thereof and includes equivalents of the present disclosure. That is, when those skilled in the art add engineering design changes to the individual embodiments as needed, the resulting embodiments are also contained in the scope of the present disclosure as long as the resulting embodiments have characteristics of the present disclosure. For example, the elements included in the individual embodiments and the layout, materials, conditions, shapes, and sizes of the elements are not limited to the illustrated examples and can be changed as appropriate. Moreover, the individual embodiments are examples, and needless to say, it should be noted that parts of the configurations in different embodiments can be substituted for one another or combined with one another. These are also contained in the scope of the present disclosure as long as these include characteristics of the present disclosure.

What is claimed is:

1. A switching circuit comprising:
a first antenna terminal and a second antenna terminal;
a first input-output terminal and a second input-output terminal;
a plurality of switches that is configured to selectively switch connection of the first input-output terminal between the first antenna terminal and the second antenna terminal, to selectively switch connection of the second input-output terminal between the first antenna terminal and the second antenna terminal, and to selectively connect the first input-output terminal and the second input-output terminal to each other; and
a ground switch that has a first end electrically connected to the second input-output terminal through one or more of the plurality of switches, and has a second end connected to ground,
wherein when the first input-output terminal is connected to the first antenna terminal, a first path switch, a second path switch, and the ground switch are in conducting states, and a third path switch is in a non-conducting state,
wherein the first path switch is one of the plurality of switches and is in a first path connecting the first input-output terminal and the first antenna terminal to each other,
wherein the second path switch is one of the plurality of switches,
wherein the second path switch and the ground switch are in a second path connecting the second input-output terminal and ground to each other, and
wherein the third path is one of the plurality of switches and is in a third path connecting the first path and the second path to each other.

2. The switching circuit according to claim 1, further comprising:
a third antenna terminal,
wherein the plurality of switches is configured to selectively switch connection of the first input-output terminal between the first antenna terminal, the second antenna terminal, and the third antenna terminal, and
wherein the plurality of switches is configured to selectively switch connection of the second input-output terminal between the first antenna terminal, the second antenna terminal, and the third antenna terminal.

3. The switching circuit according to claim 1, wherein the plurality of switches comprises:
a first switch having a first end connected to the second antenna terminal, and a second end connected to the second path.

4. The switching circuit according to claim 1, wherein a time period in which a radio wave is transmitted through the second antenna terminal is shorter than a time period in which a radio wave is transmitted through the first antenna terminal.

5. The switching circuit according to claim 4, wherein the first end of the ground switch is not directly connected to the first path or to a path connecting the second input-output terminal and the first antenna terminal to each other.

6. The switching circuit according to claim 1, wherein a sounding reference signal is transferred along a path connecting the first input-output terminal or the second input-output terminal, and the second antenna terminal, to each other.

7. The switching circuit according to claim 1,
wherein the plurality of switches comprises:
a second switch, which is between the first antenna terminal and the first input-output terminal, and which is the first path switch,
a third switch, which is between the second antenna terminal and the second input-output terminal, and which is the second path switch,
a fourth switch, which is between the second antenna terminal and the first input-output terminal, and which is part of the third path switch, and
a fifth switch, which is between the first antenna terminal and the second input-output terminal, and which is part of the third path switch, and
wherein the first end of the ground switch is electrically connected to the second input-output terminal through the third switch.

8. The switching circuit according to claim 7, further comprising:
a third antenna terminal,
wherein the plurality of switches further comprises:
a sixth switch, which is between the third antenna terminal and the first input-output terminal, and
a seventh switch, which is between the third antenna terminal and the second input-output terminal, and
wherein when the first path switch, the second path switch, and the ground switch are in conducting states, the third path switch, the sixth switch, and the seventh switch are in non-conducting states.

9. The switching circuit according to claim 1, further comprising:
a third antenna terminal; and
a third input-output terminal and a fourth input-output terminal,
wherein the plurality of switches comprises:
an eighth switch, which is between the first antenna terminal and the first input-output terminal, and which is the first path switch,
a ninth switch, which is between the third antenna terminal and the second input-output terminal, and which is part of the second path switch,
a tenth switch, which is between the second antenna terminal and the fourth input-output terminal, and which is part of the second path switch,
an eleventh switch, which is between the first antenna terminal and the third antenna terminal, and which is the third path switch,
a twelfth switch, which has a first end connected to the third antenna terminal, and which is part of the second path switch,
a thirteenth switch, which has a first end connected to the second end of the twelfth switch, has a second end connected to the second antenna terminal, and which is part of the second path switch, and
a fourteenth switch, which has a first end connected to a second end of the twelfth switch, and has a second end connected to the third input-output terminal, and wherein the first end of the ground switch is electrically connected to the second input-output terminal through the tenth switch, the thirteenth switch, the twelfth switch, and the ninth switch.

10. A front end circuit comprising:

the switching circuit according to claim 1; and a first filter circuit connected to the second input-output terminal.

11. The front end circuit according to claim 10, further comprising:

a second filter circuit connected to the first input-output terminal.

12. The front end circuit according to claim 11, wherein a pass band of the first filter circuit is different from a pass band of the second filter circuit.

13. The front end circuit according to claim 11, wherein a frequency of an attenuation pole of the first filter circuit is in a pass band of the second filter circuit.

* * * * *